(12) United States Patent
Yu

(10) Patent No.: US 11,996,387 B2
(45) Date of Patent: *May 28, 2024

(54) SEMICONDUCTOR PACKAGE

(71) Applicant: Samsung Electronics Co., Ltd., Suwon-si (KR)

(72) Inventor: Bongken Yu, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,442

(22) Filed: Jan. 31, 2022

(65) Prior Publication Data
US 2022/0157776 A1    May 19, 2022

Related U.S. Application Data

(63) Continuation of application No. 16/814,336, filed on Mar. 10, 2020, now Pat. No. 11,257,784.

(30) Foreign Application Priority Data

Sep. 16, 2019    (KR) .................. 10-2019-0113334

(51) Int. Cl.
*H01L 25/065*    (2023.01)
*H01L 23/00*    (2006.01)
*H01L 25/18*    (2023.01)

(52) U.S. Cl.
CPC .......... *H01L 25/0652* (2013.01); *H01L 24/14* (2013.01); *H01L 25/18* (2013.01);
(Continued)

(58) Field of Classification Search
CPC ..... H01L 25/0652; H01L 24/14; H01L 25/18; H01L 2224/14519; H01L 2225/0651;
(Continued)

(56) References Cited

U.S. PATENT DOCUMENTS 5,672,414 A    9/1997    Okamoto et al.
6,320,256 B1    11/2001   Ho
(Continued)

FOREIGN PATENT DOCUMENTS

JP    2000-269411 A    9/2000
JP    2007-234683 A    9/2007
(Continued)

OTHER PUBLICATIONS

Korean Office Action dated Dec. 2, 2020 issued in coresponding Korean Appln. No. 10-2019-0113334.
(Continued)

*Primary Examiner* — Thanh Y. Tran
(74) *Attorney, Agent, or Firm* — Harness, Dickey & Pierce, P.L.C.

(57) ABSTRACT

A semiconductor package includes a package substrate, a logic chip on an upper surface of the package substrate and electrically connected to the package substrate, a heat sink contacting an upper surface of the logic chip to dissipate a heat generating from the logic chip, and a memory chip disposed on an upper surface of the heat sink and electrically connected to the package substrate.

15 Claims, 9 Drawing Sheets

(52) U.S. Cl.
CPC ............... *H01L 2224/14519* (2013.01); *H01L 2225/0651* (2013.01); *H01L 2225/06517* (2013.01); *H01L 2225/06586* (2013.01); *H01L 2225/06589* (2013.01); *H01L 2924/1431* (2013.01); *H01L 2924/1434* (2013.01)

(58) Field of Classification Search
CPC . H01L 2225/06517; H01L 2225/06586; H01L 2225/06589; H01L 2924/1431; H01L 2924/1434
See application file for complete search history.

(56) References Cited

U.S. PATENT DOCUMENTS

| | | | |
|---|---|---|---|
| 6,869,825 | B2 | 3/2005 | Chiu |
| 7,429,786 | B2 | 9/2008 | Karnezos et al. |
| 7,683,470 | B2 | 3/2010 | Lee et al. |
| 7,696,618 | B2 | 4/2010 | Fan |
| 7,786,591 | B2 | 8/2010 | Khan et al. |
| 8,105,854 | B2 | 1/2012 | Lee et al. |
| 8,119,446 | B2 | 2/2012 | Lin et al. |
| 10,546,844 | B2 | 1/2020 | Kim et al. |
| 11,257,784 | B2* | 2/2022 | Yu ........................ H01L 23/4334 |
| 2014/0340849 | A1* | 11/2014 | Kim ........................ H01L 23/36 361/717 |
| 2014/0357021 | A1 | 12/2014 | Haba et al. |
| 2019/0043772 | A1 | 2/2019 | Muthur Srinath et al. |
| 2019/0237412 | A1* | 8/2019 | Lee ........................ H01L 23/16 |
| 2020/0126882 | A1 | 4/2020 | Jang et al. |
| 2020/0402883 | A1* | 12/2020 | Kim ........................ H01L 24/16 |

FOREIGN PATENT DOCUMENTS

| | | |
|---|---|---|
| JP | 5166493 B2 | 3/2013 |
| KR | 10-2013-0102405 A | 9/2013 |
| KR | 10-2017-0061468 A | 6/2017 |

OTHER PUBLICATIONS

Korean Office Action dated Jun. 7, 2021 issued in corresponding Korean Patent Application No. 10-2019-0113334.

* cited by examiner

SEMICONDUCTOR PACKAGE

CROSS-REFERENCE TO RELATED APPLICATION

This application is a continuation of U.S. application Ser. No. 16/814,336, filed on Mar. 10, 2020, which claims priority under 35 U.S.C. § 119 to Korean Patent Application No. 10-2019-0113334, filed on Sep. 16, 2019, in the Korean Intellectual Property Office, the disclosure of each of which is hereby incorporated by reference in its entirety.

TECHNICAL FIELD

Example embodiments of the present disclosure relate to a semiconductor package and a method of manufacturing the same, and, more specifically, to a system in package including a memory chip and a logic chip.

DISCUSSION OF RELATED ART

A system-in package includes a plurality of memory chips and a logic chip. The logic chip is mounted on a first package substrate. The memory chips are mounted on a second package substrate. The second package substrate on which the memory chips are mounted may be disposed on the logic chip. The memory chips and the logic chip are electrically connected to each other.

Heat generated from the logic chip may not be rapidly dissipated through the second package substrate. Thus, the heat generated from the logic chip may continue to remain in the system-in package, such that a performance of the system-in package may be degraded.

SUMMARY

Example embodiments of the inventive concept provide a semiconductor package capable of rapidly dissipating heat generated from a logic chip.

According to example embodiments of the inventive concept, a semiconductor package may include a package substrate, a logic chip on an upper surface of the package substrate and electrically connected to the package substrate, a heat sink disposed on an upper surface of the logic chip and configured to dissipate a heat generating from the logic chip, and a memory chip disposed on an upper surface of the heat sink and electrically connected to the package substrate.

According to example embodiments of the inventive concept, a semiconductor package may include a package substrate including a first pad, a second pad, a logic chip disposed on an upper surface of the package substrate and electrically connected to the first pad, a heat sink disposed on an upper surface of the logic chip and electrically insulated from the package substrate, and a memory chip disposed on an upper surface of the heat sink and electrically connected to the second pad.

According to example embodiments of the inventive concept, a semiconductor package may include a substrate, a conductive layer disposed in the substrate, a first signal pad disposed on an upper surface of the substrate and connected to the conductive layer, a second signal pad disposed on the upper surface of the substrate and connected to the conductive layer, a first dummy pad disposed on the upper surface of the substrate, a second dummy pad disposed on the upper surface of the substrate, and a heat transfer line connecting the first dummy pad and the second dummy pad, a logic chip disposed on the substrate and connected to the first dummy pad, a conductive bump interposed between the logic chip and the first signal pad, a first dummy bump interposed between the first dummy pad and the logic chip, a second dummy bump disposed on the second dummy pad, a heat sink disposed on an upper surface of the logic chip and including a heat transfer part connected to the second dummy bump, a memory chip disposed on an upper surface of the heat sink, and a conductive wire extending from the memory chip to the second signal pad.

DETAILED DESCRIPTION

Figure 1:
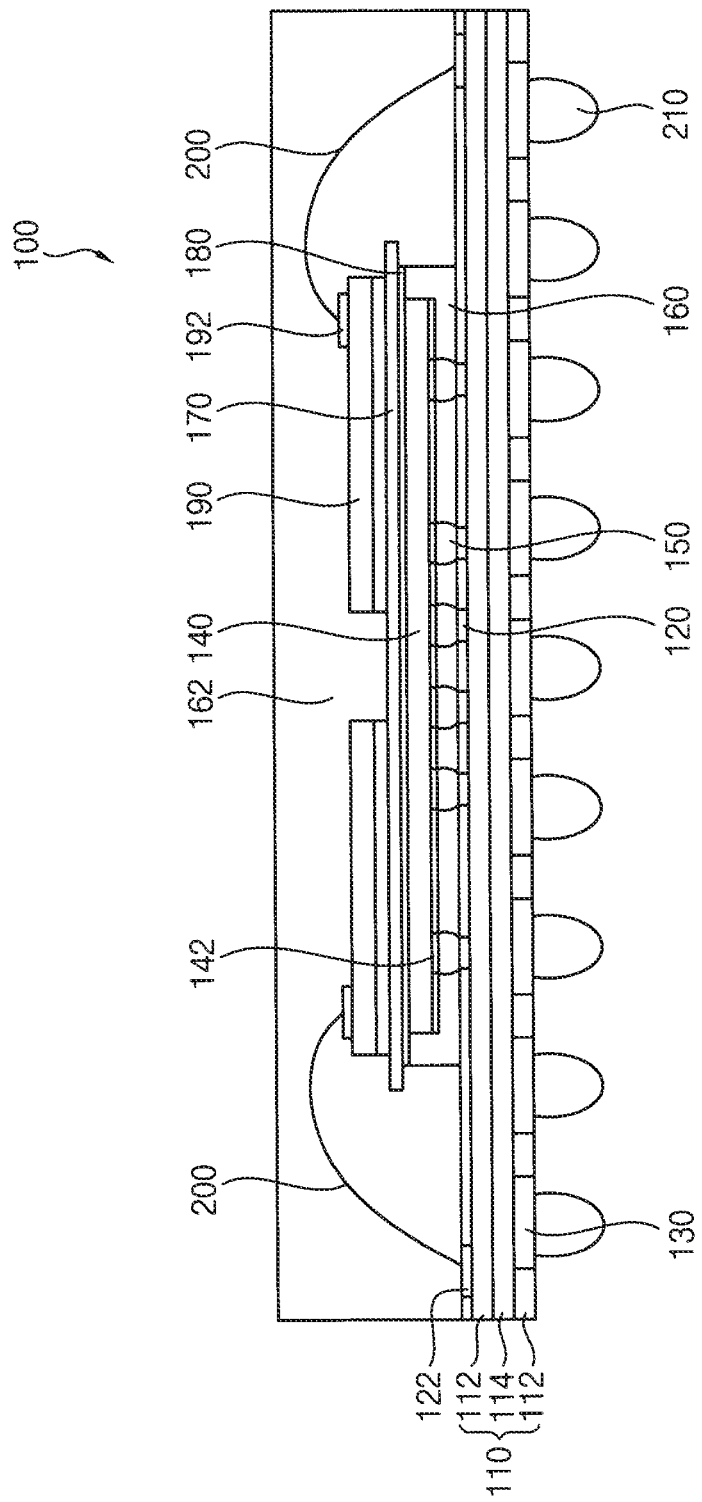
FIG. 1 is a cross-sectional view illustrating a semiconductor package according to example embodiments of the inventive concept.

Various example embodiments will now be described more fully hereinafter with reference to the accompanying drawings. Like reference numerals may refer to like elements throughout this application.

FIG. 1 is a cross-sectional view illustrating a semiconductor package according to example embodiments of the inventive concept.

Referring to FIG. 1, a semiconductor package 100 may include a package substrate 110, at least one logic chip 140, a heat sink 170, and at least one memory chip 190. The semiconductor package 100 may be a system in package including the logic chip 140 and the memory chip 190.

The package substrate 110 may include an insulation substrate 112, a conductive layer 114, upper pads, and lower pads 130. The conductive layer 114 may be formed in the insulation substrate 112. The conductive layer 114 may be partly exposed through an upper surface and a lower surface of the insulation substrate 112. The upper pads may be disposed on portions of the conductive layer 114 exposed through the upper surface of the insulation substrate 112. The lower pads 130 may be disposed on other portions of the conductive layer 114 exposed through the lower surface of the insulation substrate 112. External connection terminals 210 may be disposed on the lower pads 130, respectively.

The upper pads may include first signal pads 120 and second signal pads 122. The first signal pads 120 may be arranged on a central portion of the upper surface of the insulation substrate 112. The first signal pads 120 may be located below the logic chip 140. The second signal pads 122 may be arranged on an edge portion of the upper surface of the insulation substrate 112. The second signal pads 122 may be exposed from a sidewall of the logic chip 140.

The logic chip 140 may be disposed on a central portion of the package substrate 110. Conductive bumps 150 may be interposed between the logic chip 140 and the package substrate 110 to electrically connect the logic chip 140 to the package substrate 110. For example, the conductive bumps 150 may be disposed on the first signal pads 120. Pads 142 arranged on a lower surface of the logic chip 140 may be physically and electrically connected to the conductive bumps 150. Thus, the pads 142 of the logic chip 140 may be electrically connected to the first signal pads 120 through the conductive bumps 150.

A first molding member 160 may be disposed on the central portion of the upper surface of the package substrate 110 to partly cover the logic chip 140. An upper surface of the logic chip 140 may not be covered by the first molding member 160. Therefore, the upper surface of the first molding member 160 may exposed. The first molding member 160 may not cover the second signal pads 122. The first molding member 160 may include a first molding material having a first thermal conductivity.

A heat sink 170 may be disposed on the upper surface of the logic chip 140 and an upper surface of the first molding member 160. The heat sink 170 may be adhered to the upper surface of the logic chip 140 by an insulating adhesive 180. The insulating adhesive 180 may have a property capable of transferring the heat generated from the upper surface of the logic chip 140 to the heat sink 170. For example, the insulating adhesive 180 may include a thermal interface material (TIM). In some embodiments, the heat sink 170 may be adhered to the logic chip 140 by a general adhesive that is not the insulating adhesive 180.

According to example embodiments of the inventive concept, the heat sink 170 may be electrically insulated from the package substrate 110. The heat sink 170 may not be connected to the package substrate 110. The heat sink 170 may be disposed in the semiconductor package 100, and may act to dissipate the heat generated from the logic chip 140 to the outside. The heat sink 170 may include a metal material capable of rapidly dissipating the heat to the outside. The type of the metal material may not be limited to a specific material.

The memory chip 190 may be disposed on an upper surface of the heat sink 170. In some embodiments, a pair of memory chips 190 may be disposed on an peripheral potion of the upper surface of the heat sink 170. A pad 192 may be disposed on an upper surface of each of the memory chips 190.

The pad 192 of the memory chip 190 may be electrically connected to a corresponding one of the second signal pads 122 through a conductive wire 200. Since the heat sink 170 is not electrically connected to the package substrate 110, the memory chip 190 may be directly electrically connected to the package substrate 110 through the conductive wire 200.

A second molding member 162 may be disposed on the upper surface of the package substrate 110 to cover the heat sink 170, the memory chip 190, and the conductive wire 200. The second molding member 162 may include a second molding material having a second thermal conductivity. The second thermal conductivity may be substantially the same as or different from the first thermal conductivity. For example, the second thermal conductivity may be greater than the first thermal conductivity.

According to example embodiments of the inventive concept, a conventional package substrate on which the memory chip 190 is mounted may be replaced with the heat sink 170. The memory chip 190 disposed on the heat sink 170 may be directly electrically connected to the package substrate 110 through the conductive wire 200 without going through the heat sink 170. As such, since the heat sink 170 directly adhered to the logic chip 140 is disposed in the semiconductor package 100, the heat generated from the logic chip 140 may be rapidly dissipated to the outside through the heat sink 170 and the second molding member 162.

FIGS. 2 to 6 are cross-sectional views stages in a method of manufacturing a semiconductor package of FIG. 1 according to example embodiments of the inventive concept.

Figure 2:
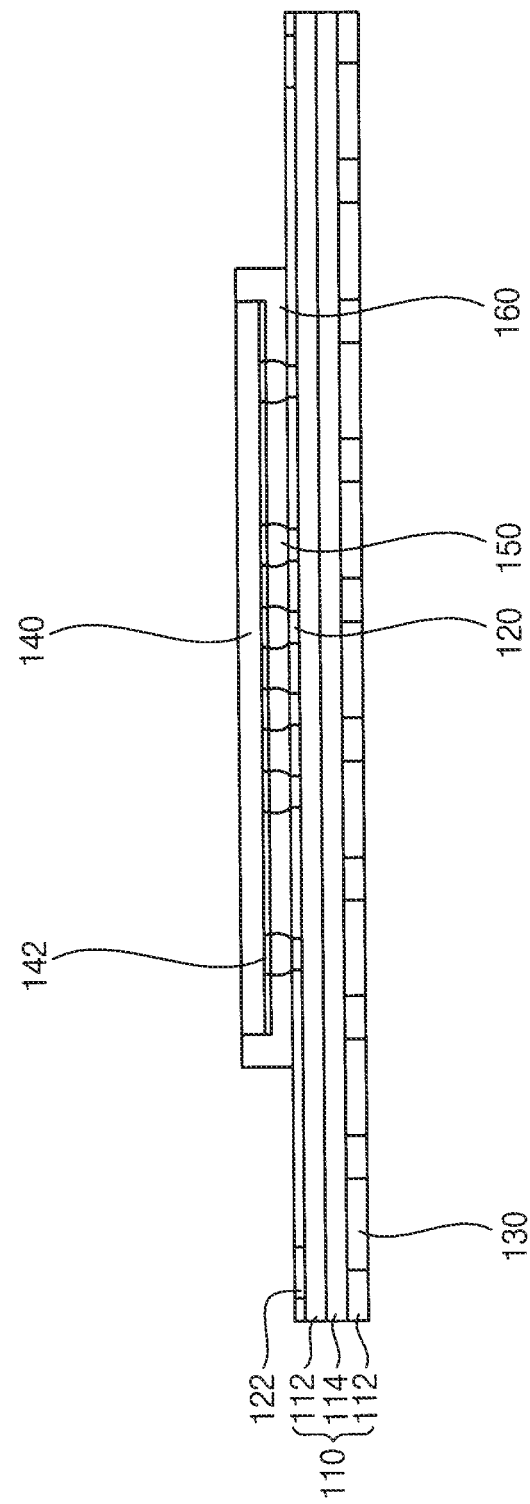
FIGS. 2 to 6 are cross-sectional views stages in a method of manufacturing a semiconductor package of FIG. 1 according to example embodiments of the inventive concept.

Referring to FIG. 2, the conductive bumps 150 may be disposed on the first signal pads 120 of the package substrate 110. The logic chip 140 may be disposed on the conductive bumps 150. Thus, the pads 142 of the logic chip 140 may be electrically connected to the first signal pads 120 through the conductive bumps 150. The first molding member 160 may be formed on the upper surface of the package substrate 110, and may surround sidewalls of the logic chip 140. The first molding member 160 may not be formed on the upper surface of the logic chip 140. Thus, the upper surface of the logic chip 140 may be exposed.

Figure 3:
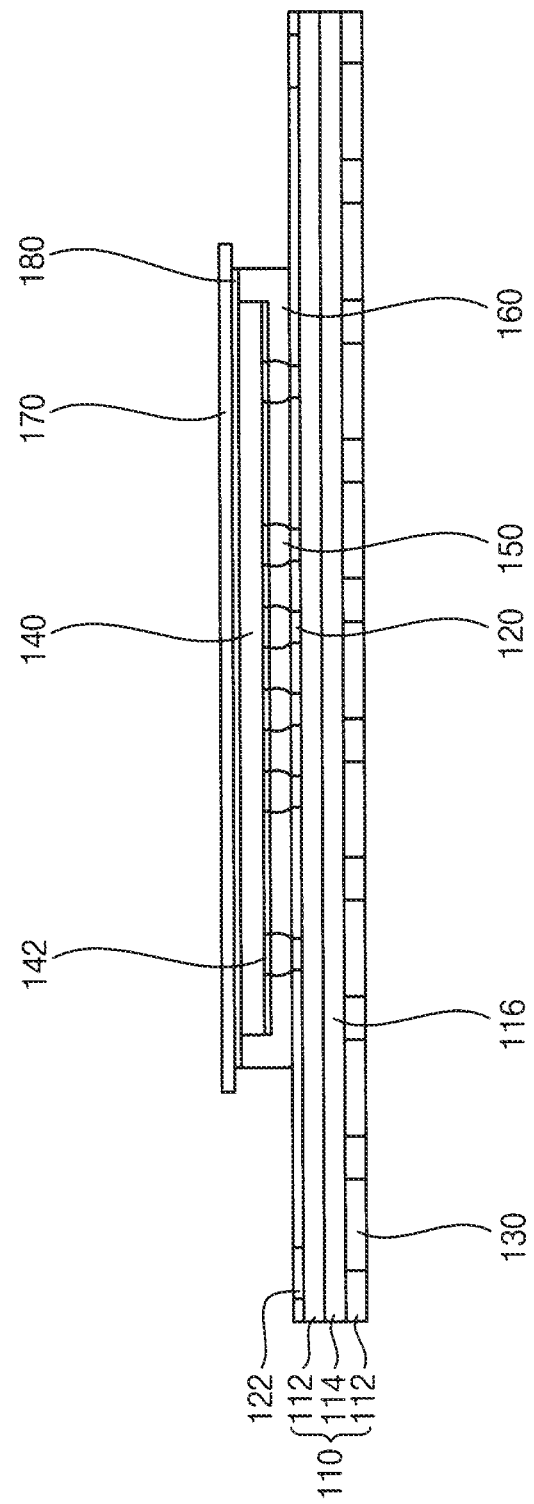

Referring to FIG. 3, the heat sink 170 may be adhered to the upper surface of the logic chip 140 by using the insulating adhesive 180, for example TIM. Thus, the heat sink 170 may contact the upper surface of the logic chip 140 by the insulating adhesive 180. Therefore, the heat dissipated from the upper surface of the logic chip 140 may be transmitted to the heat sink 170 through the insulating adhesive 180.

Figure 4:
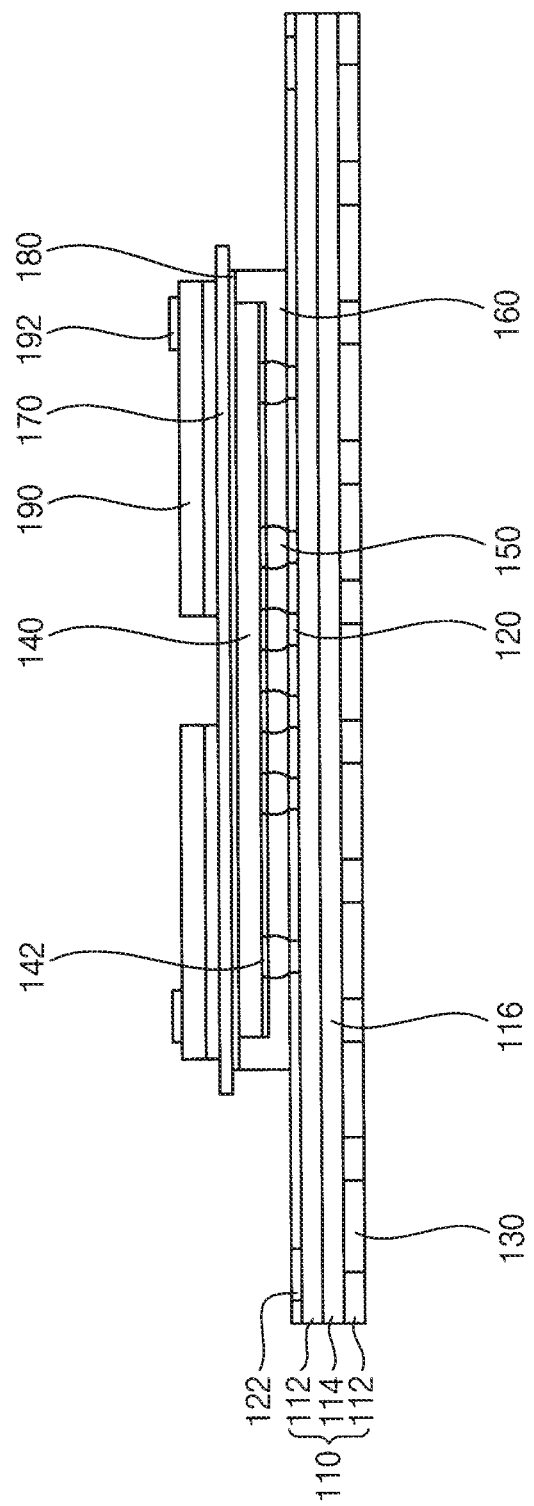

Referring to FIG. 4, the memory chips 190 may be disposed on an upper surface of the heat sink 170. The pads 192 may be located on upper surfaces of the memory chips 190.

Figure 5:
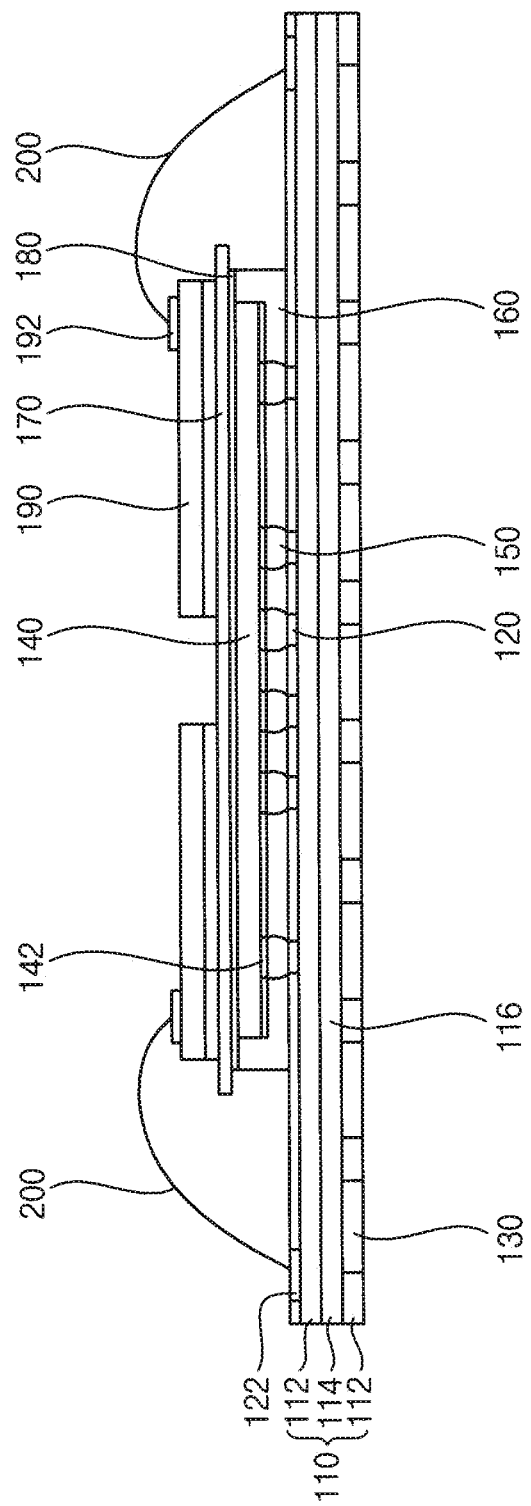

Referring to FIG. 5, the pads 192 of the memory chips 190 may be electrically connected to the second signal pads 122 using the conductive wires 200. An upper end of each of the conductive wires 200 may be connected to the pad 192 of each of the memory chips 190, and a lower end of each of the conductive wires 200 may be connected to one of the second signal pads 122.

Figure 6:
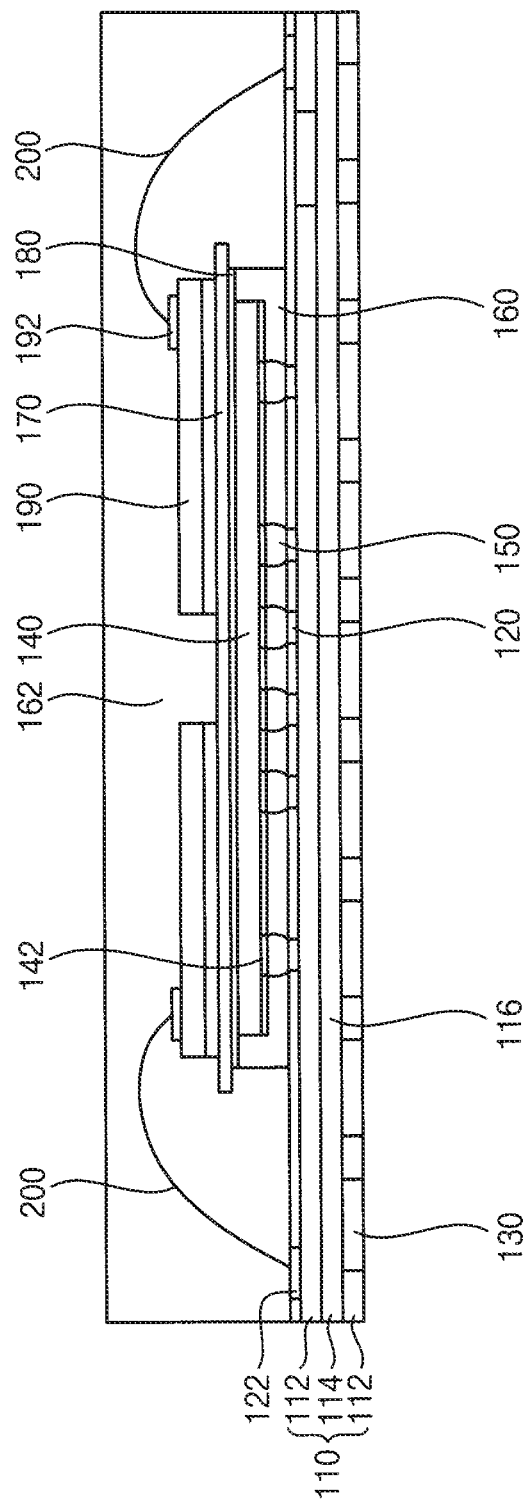

Referring to FIG. 6, the second molding member 162 may be formed on the upper surface of the package substrate 110, and may cover the memory chips 190, the heat sink 170, and the conductive wire 200.

The external connection terminals 210 may be mounted on the lower pads 130, thus completing the semiconductor package 100 shown in FIG. 1.

Figure 7:
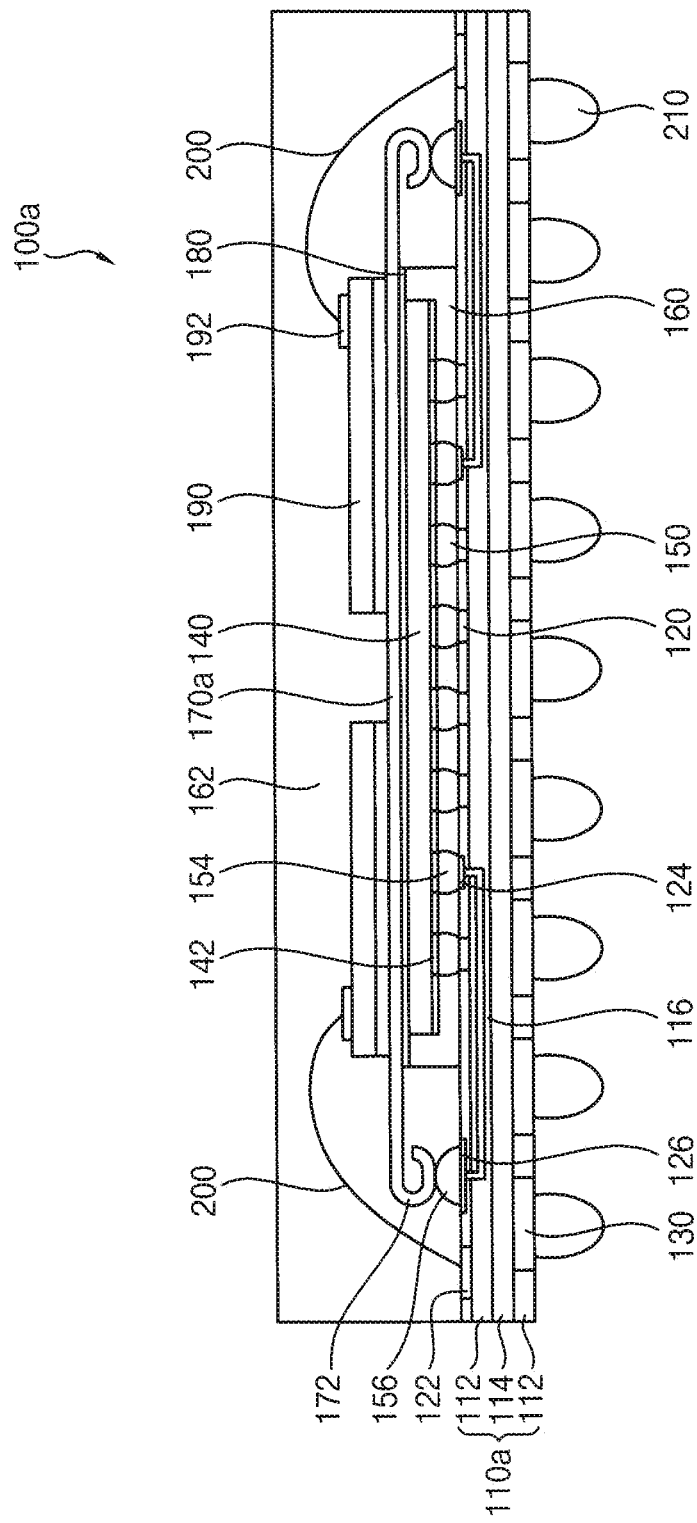
FIG. 7 is a cross-sectional view illustrating a semiconductor package according to example embodiments of the inventive concept.

FIG. 7 is a cross-sectional view illustrating a semiconductor package according to example embodiments of the inventive concept.

A semiconductor package 100*a* according to example embodiments of the inventive concept may include substantially the same elements as the semiconductor package 100 shown in FIG. 1 except for the package substrate and the heat sink. The same numerals are used to denote the same elements as those shown in FIG. 1, and thus repeated descriptions thereof are omitted or be briefly mentioned.

Referring to FIG. 7, the package substrate 110*a* may further include a first dummy pad 124, a second dummy pad 126, and a heat transfer line 116.

The first dummy pad 124 may be disposed on a central portion of an upper surface of the insulation substrate 112. The first dummy pad 124 may not be connected to the conductive layer 114. The first dummy pad 124 may not be electrically connected to a circuit in the logic chip 140. Thus, a signal generated in the circuit in the logic chip 140 may not be transmitted to the first dummy pad 124.

The second dummy pad 126 may be disposed on the upper surface of the insulation substrate 112, and may be disposed between the first signal pad 120 and the second signal pad 122. The second dummy pad 126 may not be connected to the conductive layer 114. That is, the second dummy pad 126 may be electrically insulated from the conductive layer 114.

The first dummy pad 124 and the second dummy pad 126 may be connected to each other through the heat transfer line 116. The heat transfer line 116 may be formed in the insulation substrate 112. The heat transfer line 116 may not be connected to the conductive layer 114. The heat that is emitted through a lower surface of the logic chip 140 and is transferred to the first dummy pad 124 may be transferred to the second dummy pad 126 through the heat transfer line 116. In some embodiments, the heat transfer line 116 may include a metal material capable of rapidly transferring from the first dummy pad 124 to the second dummy pad 126. However, the heat transfer line 116 may include other materials capable of transferring heat other than the metal material.

The first dummy bump 154 may be disposed on the first dummy pad 124. The first dummy bump 154 may contact the lower surface of the logic chip 140. However, the first dummy bump 154 may not be electrically connected to the circuit in the logic chip 140. The first dummy bump 154 may transfer the heat emitted from the lower surface of the logic chip 140 to second dummy pad 126 through the first dummy pad 124 and the heat transfer line 116.

The second dummy bump 156 may be disposed on the second dummy pad 126. Thus, the heat emitted from the lower surface of the logic chip 140 may be transferred to the second dummy pad 126 through the first dummy bump 154, the first dummy pad 124, the heat transfer line 116, and the second dummy pad 126. The first and second dummy bumps 154 and 156 may be formed along with the conductive bumps 150.

The heat sink 170a may include a heat transfer part 172. The heat transfer part 172 may extend from a sidewall of the heat sink 170a. The heat transfer part 172 may be connected to the second dummy bump 156. In some embodiments, the heat transfer part 172 may be directly connected to the second dummy pad 126. The heat transfer part 172 may have a bent shape toward a central portion of the package substrate 110a. In some embodiments, the heat transfer part 172 may have a linear shape.

According to example embodiments of the inventive concept, the heat emitted from the upper surface of the logic chip 140 may be transferred to the heat sink 170a. In addition, the heat emitted from the lower surface of the logic chip 140 may be transferred to the heat sink 170a through the first dummy bump 154, the first dummy pad 124, the heat transfer line 116, the second dummy pad 126, the second dummy bump 156, and the heat transfer part 172. As such, the heat sink 170a may rapidly dissipate the heat emitted from the upper surface and the lower surface of the logic chip 140 to the outside.

A method of manufacturing the semiconductor package 100a may be substantially the same processes as the processes described with reference FIGS. 2 to 6, except that a process of adhering the heat sink 170a to the upper surface of the logic chip 140 further includes a process of connecting the heat transfer part 174 to the second dummy bump 156. Therefore, repeated descriptions of the method of manufacturing the semiconductor package 100a are omitted.

Figure 8:
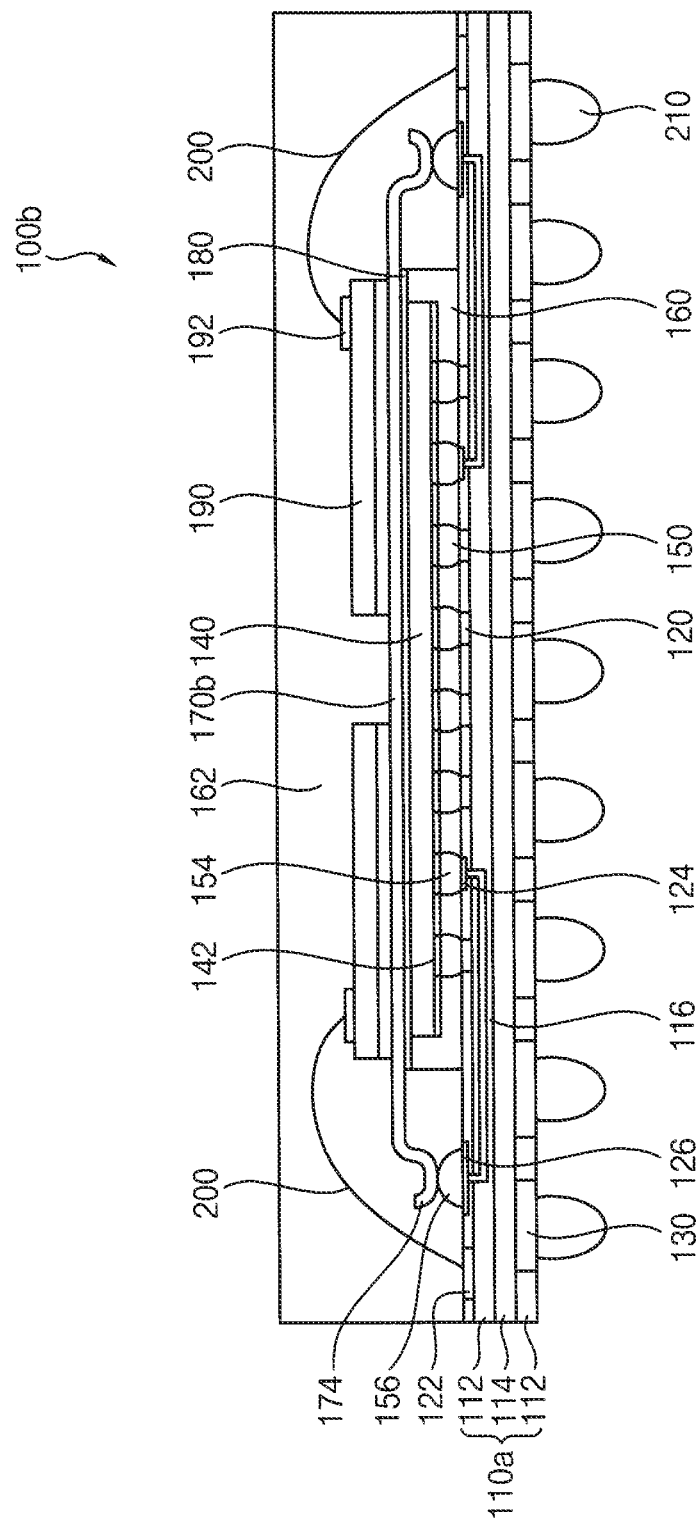
FIG. 8 is a cross-sectional view illustrating a semiconductor package according to example embodiments of the inventive concept.

FIG. 8 is a cross-sectional view illustrating a semiconductor package according to example embodiments of the inventive concept.

A semiconductor package 100b according to example embodiments of the inventive concept may include substantially the same elements as the semiconductor package 100a shown in FIG. 7 except for a shape of the transfer part. The same numerals are used to denote the same elements as those shown in FIG. 1, and thus repeated descriptions thereof are omitted or be briefly mentioned.

Referring to FIG. 8, the heat sink 170b may include a heat transfer part 174. The heat transfer part 174 may have a bent shape toward an edge portion of the package substrate 110a. The heat transfer part 174 may be connected to the second dummy bump 156. In some embodiments, the heat transfer part 174 may be directly connected to the second dummy pad 126, and may have a linear shape.

A method of manufacturing the semiconductor package 100b may be substantially the same processes as the processes described with reference FIGS. 2 to 6, except that a process of adhering the heat sink 170a to an upper surface of the logic chip 140 further includes a process of connecting the heat transfer part 174 to the second dummy bump 156. Therefore, repeated descriptions of the method of manufacturing the semiconductor package 100b are omitted.

Figure 9:
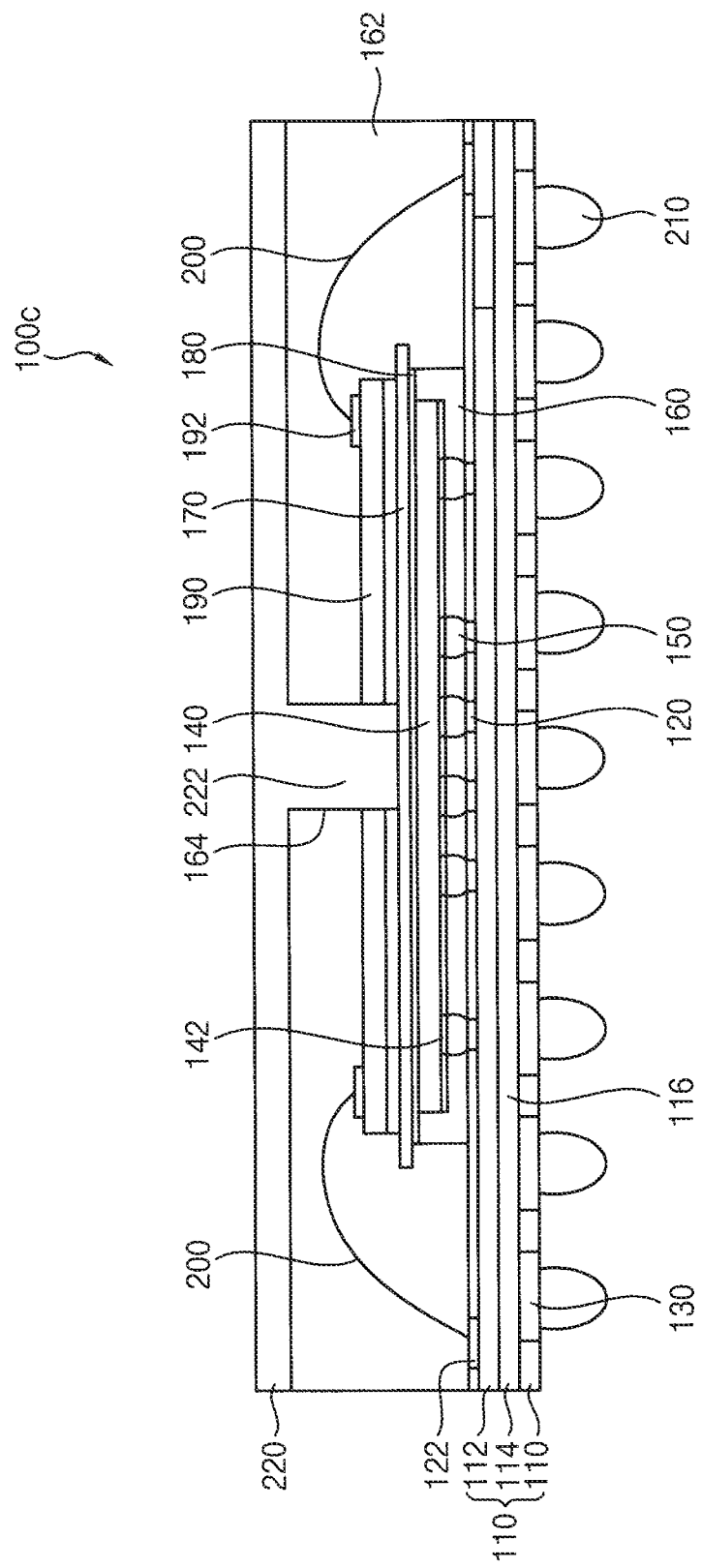
FIG. 9 is a cross-sectional view illustrating a semiconductor package according to example embodiments of the inventive concept.

FIG. 9 is a cross-sectional view illustrating a semiconductor package according to example embodiments of the inventive concept.

A semiconductor package 100c according to example embodiments of the inventive concept may include substantially the same elements as the semiconductor package 100 shown in FIG. 1 except for an external heat sink. The same numerals are used to denote the same elements as those shown in FIG. 1, and thus repeated descriptions thereof are omitted or be briefly mentioned.

Referring to FIG. 9, the second molding member 162 may include an opening 164 exposing an upper surface of the heat sink 170.

An external heat sink 220 may be disposed on an inner sidewall of the second molding member 162. The external heat sink 220 may be disposed on an upper surface of the second molding member 162. The external heat sink 220 may include a connection part 222 disposed in the opening 164. The connection part 222 may at least partly fill the opening 164. The external heat sink 220 may be connected to the heat sink 170 by the connection part 222. Thus, heat in the heat sink 170 may be rapidly dissipated to the outside of the semiconductor package 100c through the external heat sink 220. The external heat sink 220 may include the same material as the heat sink 170. In some embodiments, the external heat sink 220 may have a material different from that of the heat sink 170.

When the semiconductor package 100c includes the external heat sink 220, the heat in the logic chip 140 may be rapidly dissipated through the heat sink 170 and the external heat sink 220. Thus, the second molding member 162 may not need to have a high thermal conductivity. For example, the second thermal conductivity of the second molding member 162 may be equal to or lower than the first thermal conductivity of the first molding member 160.

The external heat sink 220 may be applied to the semiconductor package 100a shown in FIG. 7 or the semiconductor package 100b shown in FIG. 8.

A method of manufacturing the semiconductor package 100c may be substantially the same processes as the processes described with reference FIGS. 2 to 6, except for an additional process of disposing the external heat sink 220 on the upper surface of the second molding member 162. Thus, repeated descriptions of the method of manufacturing the semiconductor package 100c are omitted.

According to example embodiments of the inventive concept, since the conventional package substrate on which the memory chip is mounted may be replaced with the heat sink and the memory chip is directly connected to the package substrate, the heat generated from the logic chip may be rapidly dissipated from the heat sink. Therefore, a performance of the semiconductor package may be prevented from lowering by the heat generated from the logic chip.

While the inventive concept has been shown and described with reference to example embodiments thereof, it will be understood by those of ordinary skill in the art that various changes in form and details may be made thereto without departing from the spirit and scope of the inventive concept as set forth by the following claims.

What is claimed is:

1. A semiconductor package comprising:
   a package substrate;
   a logic chip disposed on an upper surface of the package substrate and electrically connected to the package substrate;
   a heat sink disposed on an upper surface of the logic chip and configured to dissipate a heat generating from the logic chip, the heat sink electrically insulated from the package substrate;
   a memory chip disposed on an upper surface of the heat sink and electrically connected to the package substrate;
   a first molding member surrounding sidewalls of the logic chip;
   a second molding member in direct contact with the upper surface of the package substrate and covering then upper surface of the package substrate, the heat sink and the memory chip; and
   an external heat sink disposed on an upper surface of the second molding member and connected to the heat sink.

2. The semiconductor package according to claim 1, further comprising a conductive bump interposed between the logic chip and the package substrate.

3. The semiconductor package according to claim 1, further comprising a conductive wire extending from the memory chip to the package substrate.

4. The semiconductor package according to claim 1, wherein the package substrate comprises:
   an insulation substrate;
   a conductive layer disposed in the insulation substrate;
   a first signal pad disposed on an upper surface of the insulation substrate and electrically connecting the logic chip to the conductive layer; and
   a second signal pad disposed on the upper surface of the insulation substrate and electrically connecting the memory chip to the conductive layer.

5. The semiconductor package according to claim 4, wherein the package substrate comprises:
   a first dummy pad disposed on the upper surface of the insulation substrate;
   a second dummy pad disposed on the upper surface of the insulation substrate and connected to the heat sink; and
   a heat transfer line connecting the first dummy pad to the second dummy pad and forming a heat transfer path extending from the first dummy pad to the second dummy pad.

6. The semiconductor package according to claim 5, further comprising a first dummy bump interposed between the first dummy pad and the logic chip.

7. The semiconductor package according to claim 5, wherein the heat sink includes a heat transfer part connected to the second dummy pad.

8. The semiconductor package according to claim 7, further comprising a second dummy bump interposed between the heat transfer part and the second dummy pad.

9. The semiconductor package according to claim 1, wherein the heat sink is adhered to the upper surface of the logic chip by a thermal interface material.

10. The semiconductor package according to claim 1, wherein the heat sink includes metal.

11. A semiconductor package comprising:
    a package substrate including a first pad and a second pad;
    a logic chip disposed on an upper surface of the package substrate and electrically connected to the first pad;
    a heat sink disposed on an upper surface of the logic chip and electrically insulated from the package substrate;
    a memory chip disposed on an upper surface of the heat sink and electrically connected to the second pad;
    a first molding member surrounding the logic chip;
    a second molding member in direct contact with the upper surface of the package substrate and covering the upper surface of the package substrate, the heat sink and the memory chip; and
    an external heat sink disposed on an upper surface of the second molding member and connected to the heat sink.

12. The semiconductor package according to claim 11, wherein the package substrate comprises:
    an insulating substrate including a first dummy pad, a second dummy pad connected to the heat sink, and a heat transfer line connecting the first dummy pad and the second dummy pad; and
    a conductive layer disposed in the insulation substrate.

13. The semiconductor package according to claim 12, further comprising:
    a conductive bump interposed between the logic chip and the first pad;
    a conductive wire extending from the memory chip to the second pad;
    a first dummy bump interposed between the first dummy pad and the logic chip; and
    a second dummy bump disposed on the second dummy pad.

14. The semiconductor package according to claim 13, wherein the heat sink includes a heat transfer part connected to the second dummy bump.

15. A semiconductor package comprising:
    a substrate;
    a conductive layer disposed in the substrate;
    a first signal pad disposed on an upper surface of the substrate and connected to the conductive layer;
    a second signal pad disposed on the upper surface of the substrate and connected to the conductive layer;
    a first dummy pad disposed on the upper surface of the substrate;
    a second dummy pad disposed on the upper surface of the substrate;
    a heat transfer line connecting the first dummy pad and the second dummy pad;
    a logic chip disposed on the substrate and connected to the first dummy pad;
    a conductive bump interposed between the logic chip and the first signal pad;
    a first dummy bump interposed between the first dummy pad and the logic chip;
    a second dummy bump disposed on the second dummy pad;

a heat sink disposed on an upper surface of the logic chip and including a heat transfer part connected to the second dummy bump, the heat sink electrically insulated from the substrate;
a memory chip disposed on an upper surface of the heat sink;
a conductive wire extending from the memory chip to the second signal pad;
a first molding member surrounding the logic chip;
a second molding member covering the heat sink, the memory chip and the conductive wire; and
an external heat sink disposed on an upper surface of the second molding member and connected to the heat sink.

* * * * *